United States Patent [19]

Weigl et al.

[11] 4,199,359

[45] Apr. 22, 1980

[54] PHOTOGRAPHIC SCREEN STENCIL PRINTING PROCESS

[75] Inventors: John W. Weigl, West Webster, N.Y.; Carl Brynko, Oakland, N.J.

[73] Assignee: Xerox Corporation, Stamford, Conn.

[21] Appl. No.: 533,034

[22] Filed: Dec. 16, 1974

Related U.S. Application Data

[60] Division of Ser. No. 383,006, Jul. 26, 1973, abandoned, which is a continuation-in-part of Ser. No. 729,525, May 16, 1968, abandoned.

[51] Int. Cl.² ................................................ G03F 7/12
[52] U.S. Cl. .................................... 430/308; 430/165; 430/194; 430/225; 430/274; 430/541; 430/345
[58] Field of Search ............... 96/90 R, 90 PC, 75, 96/85, 115 R, 91 R, 91 N, 91 D, 79, 80; 101/128.3, 128.4

[56] References Cited

U.S. PATENT DOCUMENTS

| | | | |
|---|---|---|---|
| 2,026,292 | 12/1935 | Van der Grinten | 96/79 |
| 2,690,967 | 10/1954 | Sharples | 96/79 |
| 2,852,379 | 9/1958 | Hepher et al. | 96/91 N |
| 3,143,417 | 8/1964 | Reichel et al. | 96/91 N |
| 3,170,792 | 2/1965 | Cunningham | 96/93 |
| 3,390,993 | 7/1968 | Borchers | 96/75 |
| 3,450,530 | 6/1969 | Amidon et al. | 96/90 PC |
| 3,619,157 | 11/1971 | Brinckman | 96/36.4 |
| 3,628,962 | 12/1971 | Murray et al. | 96/115 R |
| 3,826,650 | 7/1974 | Schlesinger | 96/36.4 |
| 3,867,147 | 2/1975 | Teuscher | 96/36.4 |

*Primary Examiner*—Charles L. Bowers, Jr.
*Attorney, Agent, or Firm*—James J. Ralabate; Peter P. Eichler

[57] ABSTRACT

A novel screen stencil comprising a screening material coated with a photo-swellable material, as well as a method of preparing and process of using same, are disclosed.

16 Claims, No Drawings

PHOTOGRAPHIC SCREEN STENCIL PRINTING PROCESS

This is a division of application Ser. No. 383,006, filed July 26, 1973, now abandoned; which is a continuation-in-part of Ser. No. 729,525, filed May 16, 1968, now abandoned.

BACKGROUND OF THE INVENTION

This invention relates in general to a novel imaging device and, more specifically, to a novel screen stencil imaging device as well as to a method of preparing and to a process of using said device.

Screen stencil printing is the modern form of one of the oldest of all printing processes. It is a modern development of the principle used by ancient Chinese and Japanese artisans who learned to make very intricate stencils by gluing cut designs to a web of hair, thus making it possible to use isolated elements which could not otherwise be held in place.

In the Middle Ages the art of screen stencil printing spread through Europe for such diverse purposes as religious images and playing cards, and by the Seventeenth Century, stencils were widely used in England for wallpaper decorations. Early American colonists used the technique for placing designs directly upon walls, furniture, textiles, etc. Silk screen printing, as it was called earlier, had no single pioneer but the idea of using a silk fabric as a screen or ground to hold the stencil generally is credited to Samuel Simon of Manchester, England.

As compared with other printing processes, screen stencil printing has several advantages. For example, it is economical for short runs of suitable subjects such as show cards, posters, charts, etc. Further, it permits printing on almost any type of surface. In addition, areas of relatively large size are easily stenciled (frames 50"×60" are frequently used for textile printing). Finally, since the object to be decorated need not be limited in thickness or even perfectly flat, the process is often used for printing on objects such as toys, novelties, and machinery which could not be run through a printing press.

The screen stencil ordinarily used consists of bolting silk pressed over a wooden frame. On this silk is the design to be stenciled. This design may be produced by manually painting the areas which are to remain white with some substance, such as gum or shellac. This results in making the treated portions of the silk impervious to the ink used. The stencil is placed in contact with the surface to be decorated and a puddle of ink is scraped from one end to the other by means of a rubber squeegee. This forces the ink through the open areas of the stencil and it adheres to the surface beneath. The stencil is then lifted from the decorated surface and the ink is allowed to dry, after which another color may be applied from another stencil, and so on.

The basic method described above is widely used as a hobby craft, as well as an art medium. In recent years more sophisticated method of making stencils and printing have come into use. For certain purposes, wire gauze or cotton fabrics may be substituted for the bolting silk, and a number of methods have been devised for putting the design on the screen. Fine detail in the pattern generally makes it advisable to make the stencil photographically by impregnating the screen with a light sensitive material such as dichromated glue to albumin, and exposing it to light under a tracing of the pattern. The image is developed by washing with water, which removes the coating from the open areas where it has not been light-hardened. Simple designs are often made by cementing patterns cut from paper, celluloid, or metal, to the screen, a common method being to cut the design from shellac-coated paper and fasten it to the core by pressing a hot iron over the two in contact.

Although there are several advantages associated with screen stencil printing, the process, as it is known today, also has decided disadvantages. For example, one drawback of screen stencil printing is that it is quite time-consuming. One must laboriously coat the screen with gum, shellac, etc., and then allow a set amount of time for drying and rinsing. Even when said stencil is made photographically, using materials such as dichromated glue, the manual process of coating said stencil is not eliminated. Thus, there is a continuing need for novel screen stencils and processes for preparing and using same which are economical, time-saving, and which require a minimum of manual work.

SUMMARY OF THE INVENTION

It is, therefore, an object of this invention to provide a novel screen stencil device and process devoid of the above-noted disadvantages.

It is another object of this invention to provide an economical and less time-consuming screen stencil process.

It is still another object of this invention to provide a novel screen stencil process requiring a minimum amount of manual work.

The foregoing objects and others are accomplished in accordance with this invention, generally speaking, by providing a novel screen stencil device comprising a screening material overcoated with a photo-swellable material. This device is prepared by a process which comprises:

(a) coating a screening material with a photo-swellable material;

(b) exposing the coated screen to a pattern of actinic radiation; and (c) heating the coated screen, causing the photoswellable material to expand, thus closing the pores of the screen stencil in the illuminated areas.

In order to produce images, said coated screen is contacted with the surface to be marked; a marking material is forced through the open areas of the screen; and the screen is then lifted from the marked surface in order to allow said surface to dry.

The screening material may be coated with the photo-swellable material either before or after it is formed into a fabric or mesh. Alternatively, the photo-swellable material may be mixed with, and actually incorporated in, those substances forming the screening material.

Any suitable screening material may be used in this process. Typical screening materials include nylon mesh, bolting silk, cotton fabrics, wire gauze, among others. In commercial, large volume work, it is preferred that mesh screens made of metal or nylon be used since these are most durable.

While it is not necessary that the screen be attached to a frame, it is preferable that a frame be used.

The frame to which the screen stencil is attached may be made of any suitable material. Typical materials include wood, rubber, plastic, metal, glass, etc. Since wood is relatively inexpensive, as well as suitable for cutting and working with, it is preferred that wood be employed as the framing material in this invention.

Any suitable photo-swellable material or photosensitive material which swells upon exposure to actinic radiation and heat may be used in this system. Typical photo-swellable materials include plastics containing suitable concentrations of photochromic compounds, light-sensitive diazo compounds, and light-sensitive azides, among others.

Photochromic compounds are basically light sensitive dyes which exhibit physical changes upon exposure to radiant energy in the ultraviolet or visible portions of the electromagnetic spectrum. In the absence of actinic radiation, these materials have a relatively stable configuration with a characteristic absorption spectrum. However, when a photochromic material is exposed to actinic radiation, such as ultra-violet light, the absorption spectrum changes drastically so that the color of the material changes from colorless to red, red to green, or the like. These spectral changes are believed to occur as a result of light-induced changes in the molecular or electronic configuration of the molecules. Simultaneously, in many instances, the effective molar volume increases, so that the effective volume occupied by the material in its photoexcited state is significantly larger than that of the original unexcited form of the same material. When such a material is embedded in a thermally deformable thermoplastic matrix, in sufficient concentrations of at least 20%, the swelling of the photochromic dye causes the entire matrix to swell significantly; that is, the density of the matrix containing the photochromic dye may be decreased, and the volume increased, by thermal softening.

Light-sensitive diazo compounds and azides are known to undergo chemical decomposition when exposed to actinic radiation. Upon actinic exposure and subsequent heating of such compounds in thermoplastic binders, bubbles of nitrogen gas are formed and trapped in said binders, causing the matrix to swell in exposed areas.

In order to be effective, the screen should conform to the following specification: $S \geq \Delta_o/(1-\Delta_o)$, wherein S is the fractional increase in linear dimension (thickness) of the screen fibers due to photoselective swelling, and $\Delta_o$ is the initial fractional open area of the screen as manufactured and coated. Thus, for example, a coating capable of a maximum swelling of 30% would require a maximum initial open area of about 23%.

Typical light-sensitive diazo compounds include p-diazo dimethylaniline zinc chloride, p-diazo diphenylamine sulfate, p-diazo diethylaniline zinc chloride, p-diazo ethyl hydroxyethylaniline zinc chloride, p-diazo ethyl methyl aniline zinc chloride, p-diazo diethyl methyl aniline zinc chloride, p-diazo ethyl hydroxyethylaniline zinc chloride, 1-diazo-2 oxy naphthaline-4 sulfonate, d-diethyl amino benzene diazonium chloride $ZnCl_2$, 4-benzoylamino-2-5-diethoxy benzene diazonium chloride, p-chlorobenzene-sulfonate of 4-diazo-1-cyclohexylaniline, p-chlorobenzenesulfonate of 4-diazo-2-methoxy-1-cyclohexylamino benzene, tin chloride double salt of 4-N-methylcyclohexylamino-benzene diazonium chloride, p-acetamino benzene diazonium chloride, 4-dimethylamino benzene diazonium chloride, 3-methyl-4-diethyl amino benzene diazonium chloride, 4-morpholino benzene diazonium chloride, 4-piperidyl 2-5-diethoxy benzene diazonium chloride, 1-dimethyl amino naphthaline-4-diazonium chloride, 4-phenyl amino diazo benzene diazonium chloride.

Although any suitable diazo compound may be used as the photo-swellable material of this invention, best results are obtained with p-diazo-dimethylaniline zinc chloride and, accordingly this material is preferred.

Any suitable azide material may be employed in the system of the instant invention. Typical azides include p-azido-benzophenone, 4,4' diazidobenzophenone, p-quinone diazides, o-quinone diazides, and p-imino-quinone diazides, the compound satisfying the formula

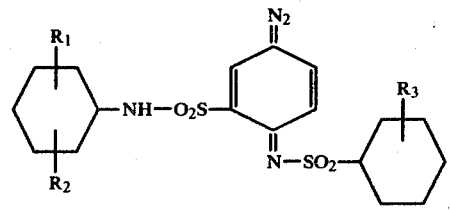

preferred of which are
$R_1 = R_2 = $ ethyl
$R_3 = $ Br
and others, such as those disclosed in Light Sensitive-Systems by Jaromir Kosar (John Wiley & Sons, Inc., 1965) which is hereby incorporated by reference.

While any suitable photo-swellable material may be employed in this system, it is preferred that a photochromic material be used because these compounds have high photosensitivities and increase significantly in effective volume when exposed to actinic radiation and subsequent heating.

Typical photochromic compounds include: SPIROPYRANS such as 1,3,3-trimethyl-6'-nitro-8'-allyl-spiro (2"H-1'-benzopyran-2,2'-indoline); 1,3,3-trimethyl-5,6'-dinitro-spiro (2'H-1'-benzopyran-2,2'-indoline); 1,3,3-trimethyl-7'-nitro-spiro (2'H-1'-benzopyran-2,2'-indoline); 3-methyl-6-nitro-spiro-[2H-1-benzopyran-2,2'-(2'H-1'-beta-naphthopyran)]; 1,3,3-trimethyl-8'-nitro-spiro (2'H-1'-benzopyran-2,2'-indoline); 1,3,3-trimethyl-6'-methoxy-8'-nitro-spiro (2'H-1'-benzopyran-2,2'-indoline); 1,3,3-trimethyl-7-methoxy-7'-chloro-spiro (2'H-1'-benzopyran-2,2'-indoline); 1,3,3-trimethyl-5 chloro-5'-nitro-8'-methoxy-spiro (2'H-1'-benzopyran-2,2'-indoline); 1,3-dimethyl-3-isopropyl-6' nitro-spiro (2'H-1'-benzopyran-2,2'-indoline); 1-phenyl-3,3-dimethyl-6'-nitro-8'-methoxy-spiro (2'H-1'-benzopyran-2,2'-indoline); 7'-nitro-spiro [xantho-10,2'(2'H-1'-benzobetanaphthopyran)]; 3,3'-dimethyl-6'-nitro-spiro (2'H-1'-benzopyran-2,2'-benzothiazole); 3,3-dimethyl-6'-nitro-spiro (2'H-1'-benzopyran-2,2'-benzo-oxazole); 1,3-trimethyl-6-nitro-spiro (2'H-1'-benzopyran-2,2'-indoline); 6'-nitro-8'-methoxy-1,3,3-trimethylindolinobenzopyrylospiran; 6'-nitro-1,3,3-trimethylindolinobenzopyrylospiran; 8'-allyl-1,3,3-trimethylindolinobenzopyrylospiran; 8'-carbomethoxy-1,3,3-trimethylindolinobenzopyrylospiran; 8'-methoxy-1,3,3-trimethylindolinobenzopyrylospiran; 6',8'-dinitro-1,3,3-trimethylindolinobenzopyrylospiran; 7'-nitro-1,3,3-trimethylindolinobenzopyrylospiran; 8'-nitro-1,3,3-trimethylindolinobenzopyrylospiran; 6',8'-dibromo-1,3,3-trimethylindolinobenzopyrylospiran; 6'-chloro-8'-nitro-1,3,3-trimethylindolinobenzopyrylospiran; 5-nitro-6'-nitro-1,3,3-trimethylindolinobenzopyrylospiran; 6'-nitro-8'-fluoro-1,3,3-trimethylindolinobenzopyrylospiran; 6'-methoxy-8'-nitro-1,3,3-trimethylindolinobenzopyrylospiran; 5'-nitro-8'-methoxy-1,3,3-trimethylindolinobenzopyrylospiran; 6'-bromo-8'-nitro-1,3,3-trimethylindolinobenzopyrylospiran; ANTHRONES such as bianthrone; xanthylideneanthrone; 4,4'-methylanthrone; 4,4'-methoxybianthrone; 3-chloro-10-(9'-xanthylidene)-anthrone; 3-methyl-10-(9'-xanthrylidene)-anthrone; 4'-chloro-10-(9'-xanthylidene)-anthrone; and 10'-9'-2'-methyl xanthylidene)-anthrone, SYDNONES such as N-(3-pyridyl)-sydnone; N-benzylsydnone; N-p-methylbenzyl-sydnone; N-3,4-dimethylbenzylsydnone; N-p-chlorobenzylsydnone; N,N'-ethylene-bissydnone; and N,N'-tetramethylenebisydnone; ANILS such as salicylidene aniline; 5-bromo salicylidene-alpha-naphthylamine; salicylidene-m-phenylenediamine; salicylidene-m-phenylenediamine; salicylidene-m-toluidene; salicylidene 3,4-xylidene; salicylidene-p-anisidine; o-nitrobenzidene-p-aminobiphenyl; o-nitrobenzidene-m-nitroaniline; o-nitrobenzidene-p-phenetidine; salicylidene-p-aminobenzoic acid; p-hydroxy benzidene-p-bromoaniline; p-hydroxy-benzidene 2,4-xylidine 2-hydroxy-3-methoxybenzidene 2,5-xylidine; and salicylidene-o-chloroaniline; HYDRAZONES such as the 2,4-dinitro-phenylhydrazone of 5-nitro-salicylaldehyde; benzaldehyde beta-naphthyl-hydrazone; benzaldehyde anislhydrazone benzaldehyde-m-chloro-phenylhydrazone; benzaldehyde-p-bromophenylhydrazone; cinnamaldehyde phenylhydrazone; cinnamaldehyde beta-naphthylhydrazone; cinnamaldehyde m-tolylhydrazone, cinnamaldehyde p-tolylhydrazone, cinnamaldehyde 3,4-xylyhydrazone; p-dimethylamino benzaldehyde beta-naphthylhydrazone 2-furaldehyde beta-naphthylhydrazone; 1-phenol-1-hexen-3-one-phenylhydrazone; piperonal anisylhydrazone; piperonal m-chlorophenyldydrazone; piperonal beta-naphthylhydrazone; piperonal m-tolylhydrazone; p-tolualdehyde phenylhydrazone; vanillin beta-naphthylhydrazone; OSAZONES such as benzil beta-naphthyl-osazone; benzil-m-tolylosazone; benzil 2,4-xylylosazone; 4,4'-dimethoxy benzil beta-naphthylosazone; 4,4'-dimethoxy benzil phenylosazone; 4,4'-dimethoxy benzil-2,4-xylylosazone; 3,4,3',4'-bis(methylenedioxy) benzil alpha-naphthylosazone; 3,4,3',4'-bis(methylenedioxy) benzil 2,4-xylylosazone; SEMICARABAZONES such as chalcone semicarbazone; chalcone phenyl semicarbazone; 2-nitrochalcone semicarbazone; 3-nitrochalcone semicarbazone; cinnamaldehyde semicarbazone; cinnamaldehyde thiosemicarbazone; o-methoxy cinnamaldehyde semicarbazone; o-methoxy cinnamaldehyde thiosemicarbazone; o-methoxy cinnamaldehyde phenylsemicarbazone; 1-(4-methoxyphenyl)-5-methyl-1-hexen-3-one-semicarbazone; 1-(1-naphthyl)1-hexen-3-one-semicarbazone; 1-phenyl-1-penten-3-one-semicarbazone; STILBENE derivatives such as 4,4'-diformamido-2,2'-stilbene disulfonic acid 4,4'-diacetamido-2,2'-stilbene disulfonic acid and its sodium, potassium, barium, strontium, calcium, magnesium and lead salts; 4,4'-bis(4-acetamidobenzoyleneamido)-2,2'-stilbene disulfonic acid; 4,4'-bis(p-acetamidobenzamido)-2,2'-stilbene disulfonic acid; FULGIDES (substituted succinic anhydrides) such as alpha-anisyl-gamma-phenyl fulgide; alpha, gamma-dianisyl fulgide; alpha, gamma-dicumyliso fulgide; alpha, gamma-diphenyl fulgide; alpha, gamma-distyryl fulgide; alpha-piperonyl-gamma-phenyl fulgide; tetraphenyl fulgide; AMINO-CAMPHOR compounds such as 3-(p-dimethylaminophenylamino)-camphor and 3-(p-diethylaminophenylamino)-camphor THIO INDIGO DYES; o-NITROBENZYL DERIVATIVES such as 2-(2',4'-dinitrobenzyl pyridine; 2,4,2'-trinitrodiphenylmethane; 2,4,2',4'-2",4"-hexanitro-triphenylmethane; ethyl bis-(2,4-dinitrophenyl) acetate; 2-(2'-nitro-4'-carboxybenzyl pyridine; 3,3'-dinitro-4,4'-bis (2-pyridylmethyl)-azoxybenzene; and, 4-(2'-nitro-4'-cyanobenzyl pyridine.

The spiropyrans are the most preferred class of materials owing to their superior photosensitivity. Of the spiropyrans, 6'-nitro-1,3,3-trimethylindolinobenzopyrlospiran is particularly photosensitive and is, therefore, a preferred spiropyran for use in this invention.

The photochromic material employed in this invention is dissolved in or dispersed in a matrix, such as a resin in order that it may adhere to a screen stencil. Any suitable resin may be used. Typical resins include Staybelite Ester 10 and Pentalyn H, glycerol and pentaerythritol esters, respectively, of partially (50%) hydrogenated rosin sold by the Hercules Powder Company of Wilmington, Delaware; Velsicol EL-11, a terpolymer of styrene, indene and isoprene, marketed by the Velsicol Chemical Company of Chicago, Illinois; polyalpha-methyl styrene; Piccolyte S-70 and S-100 (polyterpene resins made predominately from beta pinene available from the Pennsylvania Industrial Chemical Company and having ring and ball melting points of 70° C. and 100° C., respectively); Piccopale 70SF and 85 (non-reactive olefin-diene resins, available from Pennsylvania Industrial Chemical Company having melting points of 70° C. and 85° C. and molecular weights of 800 and 100, respectively); Piccodiene 2212 (a styrene-butadiene resin available from the same company); Piccolastic A-75, D-100 and E-100 (polystyrene resins with melting points of 75° C., 100° C. and 100° C. available from the same company); Neville R-21, R-9 and Nevillac Hard (coumarone-indene resins); Amberol ST137X (an unreactive, unmodified phenolformaldehyde resin available from Rohm & Haas); ethyl cellulose; ethyl hydroxy cellulose; nitrocellulose; ethyl acrylate polymer, methyl acrylate polymer; methyl methacrylate polymer, Carboset XH-1 (an acrylic acid polymer available from B. F. Goodrich Company); Pliolite AC (a styrene-acrylate copolymer); Pliolite VTAC, (a vinyl toluene acrylate copolymer); Neolyn 23 (an alkyd resin available from Hercules Powder Company); chlorinated rubber; paraffin wax; polycarbonates; polyurethanes; epoxies; polyvinyl chloride; polyvinylidene chloride; polyvinyl butyral; shellac; amine formaldehydes, polyvinyl acetals, silicones phenoxies; polyvinyl fluorides, other naturan and synthetic resins and mixtures and copolymers thereof. While any suitable resin may be used, it is preferred that Piccodiene 2212, a styrene-butadiene resin available from the Pennsylvania Industrial Chemical Co., be used since best results are obtained with this resin material.

While any suitable ratio of photo-swellable material to resin may be used in this invention, a ratio ranging from about 4:1, by weight, to about 1:20, by weight, has been found convenient. However, it is preferred that a ratio of about 1:3 be employed in order to obtain a mixture of maximum photosensitivity which, at the same time, adheres securely to a screen stencil.

The photo-swellable resin mixture is dispersed in a solvent in order that it may easily be coated upon the screen stencil. Any suitable solvent may be employed in this invention. Typical solvents include cyclohexanol, methylene chloride, carbon tetrachloride, trichloroethylene, ethyl acetate, butyl acetate, diethyl ether, dioxane, tetrahydrofuran, trichloro monofluoromethane tetrachlorodifluoromethane, benzene, toluene, xylene, cyclohexane, naphtha, turpentine, acetone, methylethyl ketone, cyclohexanone, among others.

While any suitable solvent may be employed in this invention, it is preferred that trichloroethylene be used since it is readily available at a low cost and, also, because it is a nonflammable material with non-dangerously toxic vapors.

Any convenient technique, which leaves the pores of the screen open, may be employed to coat the photoswellable material-resin solution on the screening material. Typical methods include dip coating; whirl coating, brush application, among others.

When exposing the coated screen to a light pattern, any source of electromagnetic radiation which is actinic to photo-swellable materials may be employed. In the case of most of these materials, in their lower or unexcited forms, an ultraviolet radiation source may be conveniently employed to expose the material in imagewise configuration so as to convert the exposed areas to the higher or excited form of the material.

The screen stencil may be placed in contact with any suitable surface to be marked. Typical surfaces to be marked include paper, cloth, glass, wood, celluloid, rubber, metal, linoleum, oilcloth, etc.

Any suitable marking material may be used in this invention. Typical marking materials include inks, oil, paints, water colors, dyes, lacquers, etc., so that the process may be used to produce any effect from the most delicate of pastel shades to glossy, weatherproof colors, so heavy that they stand out in visible relief.

DESCRIPTION OF PREFERRED EMBODIMENTS

The following examples will further define various preferred embodiments of the present invention. Parts and percentages are by weight unless otherwise specified.

EXAMPLE I

A 10"×12" frame, built of light-weight lumber with strong joints at the corners, is fastened to a 2'×2' wooden board with two pairs of loose-pin hinges. A piece of medium mesh nylon (48 meshes per lineal inch) is laid over the frame so that the threads are parallel to the sides of the frame. One side is tacked first in the center of one side, then toward each corner. The tacks are placed about one half inch apart. The nylon is then stretched and tacked on the opposite side, after which the remaining two sides are drawn tight and fastened. The edges and sides of the frame are then coated with shellac to hold the screen securely in place.

A thin layer of a solution consisting of about 4 grams of 6'-nitro-1,3,3-trimethylindolinobenzopyrilospiran and about 8 grams of Piccodiene 2212 resin (described above) dissolved in about 88 grams of trichloroethylene are applied to the nylon screen by means of a small brush and the coated screen then air-dried to form a coated screen of about 20% average open area. The dried coated screen is exposed to a transparency image with a 9-Watt fluorescent light, available from the Eastern Corporation of Westburg, Long Island, under the tradename "Blacklite" using a filter which passes about a 10 angstrom bandwidth centerd on 3660 angstroms until a clearly visible pattern is formed on the screen in illuminated areas. The screen is then heated for a short period of time. This causes the coating material to expand by about 30%. The exposed areas become fixed upon cooling and inspection indicates that image areas are swollen to about ⅓ above their normal size, thus closing the pores of the screen stencil in the illuminated areas. The stencil is then placed over the surface of a sheet of paper, 8"×11", and a squeegee, which is as long as the width of the frame, is placed at the top of the frame.

About 5 cc. of a fairly viscous ink is poured upon the screen at one end and pulled across the screen with an even pressure sroke of the squeegee. This action forces the writing fluid through the open portions of the stencil. This operation is repeated on other sheets of paper until 100 copies have been printed. The surfaces of said copies are allowed to dry for about 1 to 2 minutes.

EXAMPLES II–III

The procedure of Example I is repeated with the exception that in Example II about 4 grams of the resin and about ½ gram of the 6'-nitro-1,3,3-trimethylinodolinobenzopyrilolospiran are used in the coating solution, while in Example III the ratio is 1 gram of resin to 2 grams of the same photochromic spiran compound. Each of these produces about similar results to those produced by Example I except that the swelling in Example II is only about 10% necessitating a thicker coating leaving about 8% open area. In Example III the swelling is about 35%, which is only slightly more than Example I. This indicates that there is little advantage in using more than about 33% by weight of photo-swellable material.

EXAMPLES IV–XV

The procedure of Example I is followed exactly with the exception that the following resins are substituted for the resin of Example I in Examples IV–XV, respectively; Piccolyte S-70, Piccolyte S-100, Piccopale 70SF, Piccopale 85, Amberol-ST-137X resin, alphamethylstyrene polymer, Staybelite Ester 10, Piccolastic D-100, Piccolastic E-100, Neville R-9, Neville R-21 and Nevillac Hard (described above). All produce about the same results as Example I, it being understood that each resin must be heated to its particular optimal softening point.

EXAMPLES XVI–XVIII

In Examples XVI and XVIII the procedure of Example I is repeated except that the photochromic compound employed is 3-N-pyridyl sydnone in Example XVI; in Example XVII, bianthrone is employed; and in Example XVIII 3-N-pyridyl salicylidene is used. In these examples the procedure of Example I is followed except that the same filter is employed with a 100 Watt light source for a 20 minute exposure. In all instances the images formed are about equal in quality with the one produced by the procedure of Example I.

EXAMPLES XIX–XXIV

The procedure of Example I is followed with the exception that the following photochromic compounds are used respectively, in Examples XIX–XXIV in place of the spiropyran photochromic compound of Example I: benzil betanaphthylosazone; 2-nitrochalcone semicarbazone; alpha, gamma-diphenyl fulgide; 4,4'-diformamido-2,2'-stilbene disulfonic acid; 3-(p-dimethylaminophenylamino)-camphor; and 2-(2',4'-dinitrobenzyl)pyridine. These produce essentially the same results as Example I when a 20 minute exposure is employed.

EXAMPLES XXV–XXIX

The procedure of Example I is followed with the exception that the following photo-swellable materials are used, respectively, in Examples XXV–XXIX in place of the spiropyran photochromic compound of Example I: p-diazo-dimethylaniline zinc chloride (Example XXV); p-diazo dephenylamine sulfate (Example XXVI); 4-benzoylamino-2-5-diethoxy benzene diazonium chloride (Example XXVII); 4-piperidyl 2-5-diethoxy benzene diazonium chloride (Example XXVIII); and 1 diazo-2 oxy naphthalene-4 sulfonate (Example XXIX); and the following resins are used, respectively, in Examples XXV–XXIX in place of the Piccodiene 2212 resin in Example I: copolymers of vinyl chloride and vinylidene chloride (Example XXV); vinyl chloride and acrylonitrile (Example XXVI); styrene and acrylonitrile (Example XXVII); vinyl acetate and vinylidene cyanide (Example XXVIII); vinylidene chloride and methyl methacrylate (Example XXIX). Essentially the same results as in Example I are produced.

EXAMPLES XXX–XXXII

The procedure of Example I is followed with the exception that the following materials are used, respectively, to receive the marking materials in Examples XXX–XXXII: cotton cloth (Example XXX); linoleum (Example XXI); and oilcloth (Example XXXII). Essentially the same results as in Example I are produced.

EXAMPLES XXXIII–XXXV

The procedure of Example I is followed with the exception that the following solvents are used, respectively, as the dispersing medium for the photo-swellable mixture in Examples XXXIII–XXXV in place of the trichloroethylene used in Example I: toluene (Example XXXIII); carbon tetrachloride (Example XXXIV); and xylene (Example XXXV). Essentially the same results as in Example I are produced.

EXAMPLES XXXVI–XXXVII

The procedure of Example I is followed with the exception that the following materials are used, respectively, as the screening material in Examples XXXVI–XXXVII in place of nylon in Example I: medium mesh silk (Example XXXVI) and wire gauze (Example XXXVII). Essentially the same results as in Example I are produced.

EXAMPLE XXXVIII

Example I is repeated except that the nylon threads are coated with the photo-swellable mixture prior to being woven into a mesh screening material. Essentially the same results as in Example I are produced.

Although specific materials and conditions are set forth in the above examples, these are merely illustrative of the present invention. Various other materials, such as any of the typical photo-swellable materials and/or resins listed above which are suitable, may be substituted for the materials listed in the examples with similar results. The coating solution of this invention may also have other materials mixed, dispersed, copolymerized or otherwise added thereto to enhance, sensitize, synergize, or otherwise modify the properties thereof. Many modifications and/or additions to the process will readily occur to those skilled in the art upon reading this disclosure, and these are intended to be encompassed within the spirit of the invention.

What is claimed is:
1. A screen stencil printing process comprising:
(a) providing a screening material,
(b) coating the surface of the screening material conforming to the following specification

$$S \geq \Delta_o/(1-\Delta_o)$$

wherein
S is the fractional increase in linear dimension (thickness) of the screen fibers due to photoselective swelling,
$\Delta_o$ is the initial fractional open area of the screen as manufactured and coated,
with a photosensitive material such that open areas are provided for expansion of said material into said open areas, said open areas of said screen being located between the coated screen fibers, said photosensitive material being capable of swelling upon exposure to actinic radiation and heat and being selected from the group consisting of photochromic compound-resin mixtures, diazo compound-resin mixtures, resin mixtures with a compound selected from the group consisting of p-azido-benzophenone, 4,4'-diazodobenzophenone, p-quinone diazides and a compound satisfying the formula

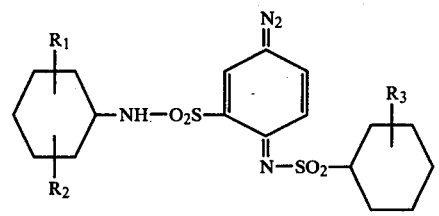

wherein
$R_1 = R_2 = $ ethyl
$R_3 = $ Br
and mixtures thereof, the ratio of said compound material to said resin material ranging from 4:1 by weight to about 1:20 by weight;
(c) exposing said screening material to a pattern of actinic radiation;
(d) heating said screening causing the photosensitive material to expand, thereby closing the open areas of the screen in the illuminated areas;
(e) allowing said screening to cool;
(f) contacting said screening with the surface to be marked;
(g) forcing a marking material through the open areas of said screening;
(h) lifting said screening from the marked surface; and
(i) allowing said surface to dry.
2. The process as defined in claim 1 wherein said screening material is selected from the group consisting of nylon, wire gauze, and silk.
3. The process as defined in claim 1 wherein said photosensitive material comprises a photochromic compound-resin mixture.
4. The process as defined in claim 3 wherein said photochromic compound comprises a spiropyran.
5. The process as defined in claim 1 wherein said resin is selected from the group consisting of a styrene-butadiene resin, a polyterpene resin, an olefin-diene resin, a phenolformaldehyde resin, an alpha methylstyrene resin, a polystyrene resin, a coumarone-indene resin, and mixtures thereof.

6. The process as defined in claim 3 wherein said spiropyran is 6'-nitro-1,3,3-trimethylindolinobenzopyrlospiran.

7. A screen stencil printing process comprising:
(a) providing a screening material,
(b) coating the fibers of said screening material with a swellable photosensitive material which swells upon exposure to actinic radiation and heat and conforms to the following specification $$S \geq \Delta_o/(1-\Delta_o)$$

wherein
S is the fractional increase in linear diameter of the coated fibers due to photo-selective swelling
$\Delta_o$ is the initial fractional open area of the coated screen prior to exposure to actinic radiation, said open area being located between the coated screen fibers
said photosensitive material being selected from the group comprising photochromic compound-resin mixtures, diazo compound-resin mixtures, mixtures of resin and a compound selected from the group consisting of p-azido-benzophenone, 4,4'-diazodobenzophenone, p-quinone diazides and a compound satisfying the formula

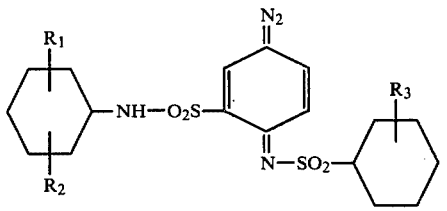

wherein
$R_1 = R_2 = $ ethyl
$R_3 = Br$
and mixtures thereof, the ratio of compound of said resin being from about 4 to 1 to about 1 to 20 by weight;
(c) exposing said screening to a pattern of actinic radiation;
(d) heating said screening causing the photosensitive material to expand, thereby closing the open areas of the screen stencil in the illuminated areas;
(e) allowing said screening to cool;
(f) contacting said screening with the surface to be marked;
(g) forcing a marking material through the open areas of said screening;
(h) lifting said screening from the marked surface; and
(i) allowing said surface to dry.

8. The process as defined in claim 7 wherein said photosensitive material comprises a spiropyran-resin mixture.

9. The process as defined in claim 8 wherein said spiropyran is 6'-nitro-1,3,3-trimethylindolinobenzopyrlospiran.

10. The process as defined in claim 7 wherein said resin is selected from the group consisting of a styrene-butadiene resin, a polyterpene resin, an olefin-diene resin, a phenolformaldehyde resin, an alpha methylstyrene resin, a polystyrene resin, a coumarone-indene resin, and mixtures thereof.

11. The process of claim 7 wherein said photosensitive material is a resin-p-diazo-dimethylaniline zinc chloride mixture.

12. A screen stencil process comprising:
(a) providing a screen,
(b) coating said screen with a photo-swellable material which swells upon exposure to actinic radiation and heat such that open pores remain at the interstices between the fibers of said screen, said photoswellable material selected from the group consisting of a mixture of resin and a compound selected from the group consisting of p-azido-benzophenone, 4,4'-diazodobenzophenone, p-quinone diazides and a compound satisfying the formula

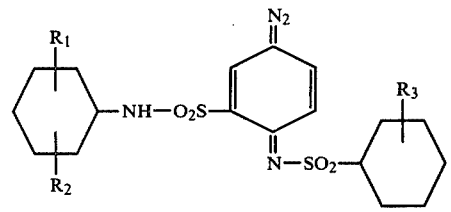

wherein
$R_1 = R_2 = $ ethyl
$R_3 = Br$
photochromic compound-resin mixtures and diazo compound-resin mixtures, the ratio of said compound to said resin being from about 4 to 1 to about 1 to 20 by weight,
(c) exposing said screen to a pattern of actinic radiation,
(d) heating said screen causing the photosensitive material to expand, thereby closing said open pores of said screen in the illuminated areas,
(e) allowing said screen to cool,
(f) contacting said screen with the surface to be marked,
(g) forcing a marking material through the open areas of said screen,
(h) lifting said screen from the marked surface, and
(i) allowing said surface to dry, with the proviso that said coated screen conforms to the specification $$S \geq \Delta_o/(1-\Delta_o)$$

wherein
S is the fractional increase in coated fiber diameter due to photoselective swelling of the coated screen fibers and
$\Delta_o$ is the initial fractional open area of the pores of the coated screen prior to exposure to actinic radiation.

13. The process as defined in claim 12 wherein said photosensitive material comprises a spiropyran-resin mixture.

14. The process as defined in claim 13 wherein said spiropyran is 6'-nitro-1,3,3-trimethylindolinobenzopyrlospiran.

15. The process as defined in claim 12 wherein said resin is selected from the group consisting of a styrene-butadiene resin, a polyterpene resin, an olefin-diene resin, a phenolformaldehyde resin, an alpha methylstyrene resin, a polystyrene resin, a coumarone-indene resin, and mixtures thereof.

16. The process of claim 12 wherein said photosensitive material is a resin-p-diazo-dimethylaniline zinc chloride mixture.

* * * * *